United States Patent
Chan et al.

(10) Patent No.: US 9,899,498 B2
(45) Date of Patent: Feb. 20, 2018

(54) SEMICONDUCTOR DEVICE HAVING SILICON-GERMANIUM LAYER ON FIN AND METHOD FOR MANUFACTURING THE SAME

(71) Applicant: UNITED MICROELECTRONICS CORP., Hsinchu (TW)

(72) Inventors: Tien-Chen Chan, Tainan (TW); Yi-Fan Li, Tainan (TW); Yen-Hsing Chen, Taipei (TW); Chun-Yu Chen, Taichung (TW); Chung-Ting Huang, Kaohsiung (TW); Zih-Hsuan Huang, Tainan (TW); Ming-Hua Chang, Tainan (TW); Yu-Shu Lin, Pingtung County (TW); Shu-Yen Chan, Yuanlin (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/590,510

(22) Filed: May 9, 2017

(65) Prior Publication Data

US 2018/0019324 A1    Jan. 18, 2018

Related U.S. Application Data

(62) Division of application No. 15/207,916, filed on Jul. 12, 2016, now Pat. No. 9,680,022.

(51) Int. Cl.
  *H01L 21/336*  (2006.01)
  *H01L 29/66*   (2006.01)
  *H01L 21/02*   (2006.01)

(52) U.S. Cl.
  CPC .... *H01L 29/66795* (2013.01); *H01L 21/0262* (2013.01); *H01L 21/02532* (2013.01); *H01L 29/66636* (2013.01)

(58) Field of Classification Search
  CPC ................. H01L 29/66795; H01L 29/66636
  USPC ........................................... 438/283
  See application file for complete search history.

(56) References Cited

U.S. PATENT DOCUMENTS

| 6,475,869 B1 | 11/2002 | Yu |
| 2007/0034971 A1 | 2/2007 | Anderson et al. |
| 2015/0214351 A1 | 7/2015 | Basker et al. |

*Primary Examiner* — Anthony Ho
(74) *Attorney, Agent, or Firm* — WPAT, PC

(57) ABSTRACT

A semiconductor device is provided, including a substrate with an isolation layer formed thereon, wherein the substrate has a fin protruding up through the isolation layer to form a top surface and a pair of lateral sidewalls of the fin above the isolation layer; a silicon-germanium (SiGe) layer epitaxially grown on the top surface and the lateral sidewalls of the fin; and a gate stack formed on the isolation layer and across the fin, wherein the fin and the gate stack respectively extend along a first direction and a second direction. The SiGe layer formed on the top surface has a first thickness, the SiGe layer formed on said lateral sidewall has a second thickness, and a ratio of the first thickness to the second thickness is in a range of 1:10 to 1:30.

11 Claims, 7 Drawing Sheets

SEMICONDUCTOR DEVICE HAVING SILICON-GERMANIUM LAYER ON FIN AND METHOD FOR MANUFACTURING THE SAME

CROSS REFERENCE TO RELATED APPLICATIONS

This application is a Divisional of pending U.S. patent application Ser. No. 15/207,916, filed Jul. 12, 2016 (now allowed) and entitled "SEMICONDUCTOR DEVICE HAVING SILICON-GERMANIUM LAYER ON FIN AND METHOD FOR MANUFACTURING THE SAME", the contents of which are incorporated herein by reference.

BACKGROUND

Technical Field

The disclosure relates in general to a semiconductor device and a method for manufacturing the same, and more particularly to a semiconductor device having silicon-germanium (SiGe) layer formed on the fin and a method for manufacturing the same.

Description of the Related Art

Electrical properties, reduction of feature size, improvements of the operation efficiency, and the density and the cost per integrated circuit unit are the important goals in the semiconductor technology. The properties of the semiconductor device have to be maintained even improved to meet the requirements of the commercial products in applications. For example, the carrier mobility in the channel of the FinFET should reach a certain level. How to increase the carrier mobility in the channel of the finFET is one of the important issues of the device for the manufacturers.

SUMMARY

The disclosure is directed to a semiconductor device having silicon-germanium (SiGe) layer formed on the fin and a method for manufacturing the same. The proposed structure and method of the present embodiments effectively reduces strain difference between the bottom and the top of the fin, thereby effectively increases the carrier mobility in the fin channel and improving the electrical characteristics of the semiconductor device.

According to one aspect of the present disclosure, a semiconductor device is provided, including a substrate with an isolation layer formed thereon, wherein the substrate has a fin protruding up through the isolation layer to form a top surface and a pair of lateral sidewalls of the fin above the isolation layer; a silicon-germanium (SiGe) layer epitaxially grown on the top surface and the lateral sidewalls of the fin; and a gate stack formed on the isolation layer and across the fin, wherein the fin and the gate stack respectively extend along a first direction and a second direction. The SiGe layer formed on the top surface has a first thickness, the SiGe layer formed on said lateral sidewall has a second thickness, and a ratio of the first thickness to the second thickness is in a range of 1:10 to 1:30.

According to another aspect of the present disclosure, a method for manufacturing a semiconductor device is provided. A substrate with an isolation layer formed thereon is provided, wherein the substrate has a fin protruding up through the isolation layer to form a top surface and a pair of lateral sidewalls of the fin above the isolation layer. A silicon-germanium (SiGe) layer is formed (such as epitaxially grown) on the top surface and the pair of lateral sidewalls of the fin, wherein the SiGe layer formed on the top surface has a first thickness, the SiGe layer formed on the lateral sidewall has a second thickness, and a ratio of the first thickness to the second thickness is in a range of 1:10 to 1:30. Then, a gate stack is formed on the isolation layer and across the top surface and the pair of lateral sidewalls of the fin, wherein the fin extends along a first direction, and the gate stack extends along a second direction different from the first direction.

Figure 1A:
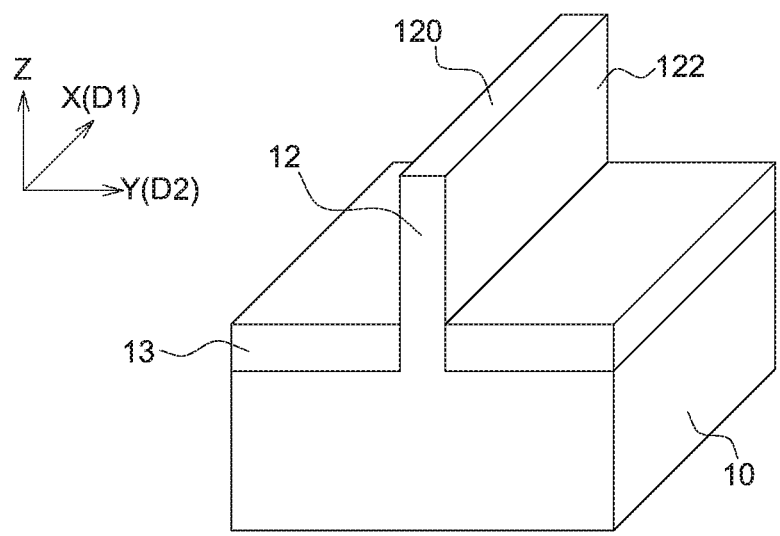
FIG. 1A-FIG. 1E illustrate a method for manufacturing a semiconductor device according to the first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a semiconductor device and a method for manufacturing the same are provided, by forming (such as epitaxially growing) a silicon-germanium (SiGe) layer on the top surface and the pair of lateral sidewalls of the fin above the isolation layer. In one embodiment, the silicon-germanium (SiGe) layer could be directly formed on the top surface and the pair of lateral sidewalls of the fin above the isolation layer by epitaxial growth using a precursor with particular combination. The present invention can be applied to manufacture different types of the semiconductor devices having fins for reducing the strain difference between the bottom and the top of the fin, thereby increasing the carrier mobility in the channel and improving the electrical characteristics of the semiconductor devices.

Embodiments are provided hereinafter with reference to the accompanying drawings for describing the related procedures and configurations. For example, a semiconductor device having the first gate structures with narrower gate lengths in the first area and the second gate structures with wider gate lengths in the second area is exemplified for illustration. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIRST EMBODIMENT

FIG. 1A-FIG. 1E illustrate a method for manufacturing a semiconductor device according to the first embodiment of the disclosure. First, a substrate 10 having a fin 12 and an isolation layer 13 formed on the substrate 10 is provided. The fin 12 protrudes up through the isolation layer 13 to form a top surface 120 and a pair of lateral sidewalls 122 of the fin 12 above the isolation layer 13, as shown in FIG. 1A.

Figure 1B:
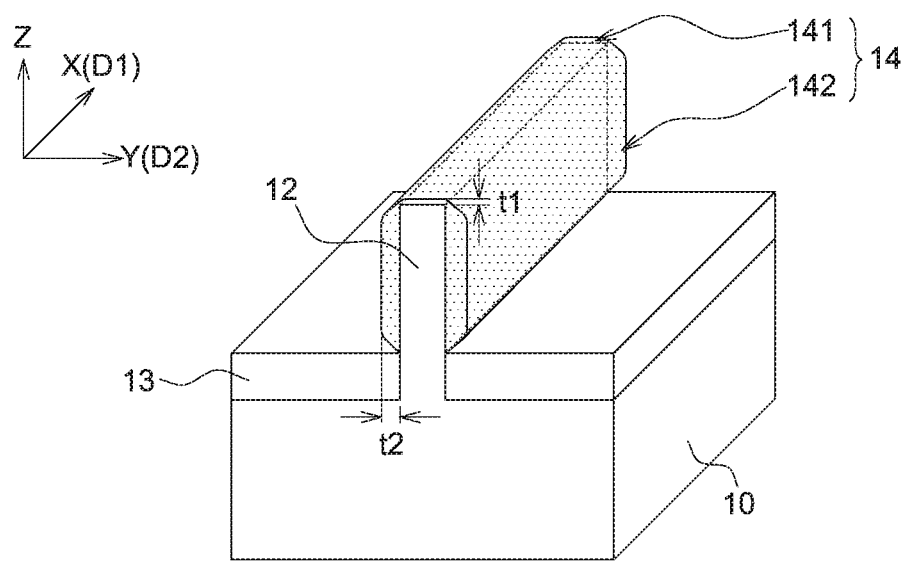

Then, a silicon-germanium (SiGe) layer 14 is formed on the top surface 120 and the pair of lateral sidewalls 122 of the fin 12, as shown in FIG. 1B. In the embodiment, the portions 141 and 142 of the SiGe layer 14 are epitaxially grown on the top surface 120 and the pair of lateral sidewalls 122 of the fin 12, respectively.

According to the embodiment, the SiGe layer 14 is grown by using a precursor comprising dichlorosilane (DCS, $SiCl_2H_2$) or silane ($SiH_4$) in a flow rate larger than 100 standard cubic centimeters per minute (sccm). In one embodiment, the precursor comprises dichlorosilane or silane in the flow rate larger than 100 sccm but no more than 300 sccm. Furthermore, the precursor may further comprise germane ($GeH_4$) in a flow rate of 200 sccm to 900 sccm, wherein a flow ratio of germane ($GeH_4$) to dichlorosilane (DCS) is in a range of 3 to 8. Also, the precursor may further comprise hydrochloric acid (HCl), wherein a flow ratio of HCl is in a flow rate of 150 sccm to 300 sccm. In one embodiment, a flow ratio of germane ($GeH_4$) to hydrochloric acid (HCl) is in a range of 3 to 8. In one embodiment, the SiGe layer 14 contains 20% to 75% of germanium (Ge).

Moreover, the portion 141 of the SiGe layer 14 formed on the top surface 120 of the fin 12 is thinner than the portion 142 of the SiGe layer 14 formed on the lateral sidewalls 122 of the fin 12. In one embodiment, the portion 141 of the SiGe layer 14 formed on the top surface 120 of the fin 12 has a first thickness t1, while the portion 142 of the SiGe layer 14 formed on the lateral sidewalls 122 of the fin 12 has a second thickness t2. The first thickness t1 of the SiGe layer 14 can be the maximum thickness of the SiGe layer 14 formed on the top surface 120 of the fin 12 (i.e. the maximum thickness of the portion 141). Similarly, the second thickness t2 of the SiGe layer 14 can be a maximum thickness of the SiGe layer 14 formed on the lateral sidewall 122 of the fin 12 (i.e. the maximum thickness of the portion 142). In one embodiment, a ratio of the first thickness t1 to the second thickness t2 (i.e. t1: t2) is in a range from 1:10 to 1:30. Also, in one embodiment, the second thickness t2 of the portion 142 of the SiGe layer 14 formed on one of the pair of lateral sidewalls 122 of the fin 12 is in a range of 20Å to 50Å.

Figure 1C:
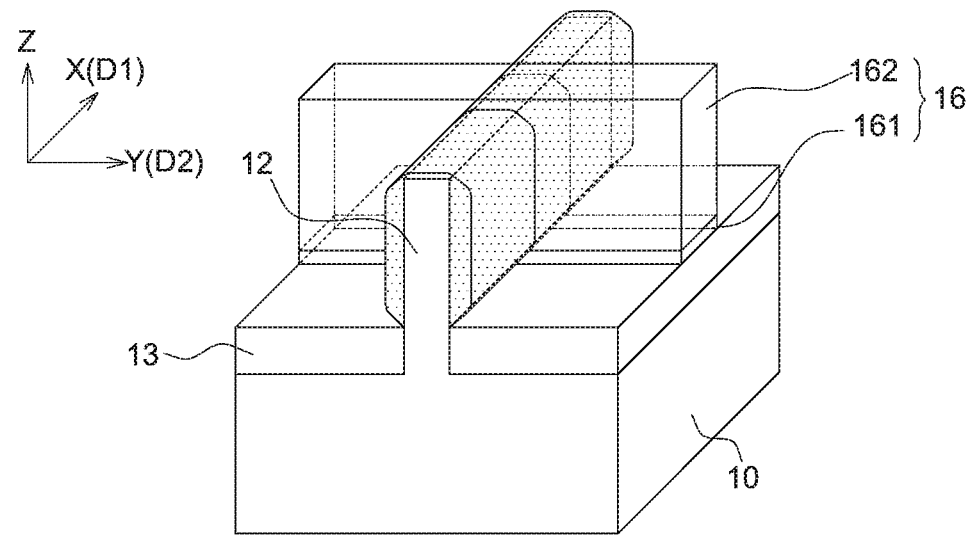

Afterwards, a gate stack 16 is formed on the isolation layer 13 and across the top surface 120 and the pair of lateral sidewalls 122 of the fin 12 in the first embodiment, as shown in FIG. 1C. In one embodiment, the fin 12 extends along a first direction D1 (such as X-direction), and the gate stack 16 extends along a second direction D2 (such as Y-direction), wherein the second direction D2 is different from the first direction D1; for example, D2 is vertical to D1. Also, in one embodiment, the gate stack 16 includes a gate dielectric layer 161 formed on the isolation layer 13 and a gate electrode layer 162 formed on the gate dielectric layer 161, wherein the gate dielectric layer 161 contacts the SiGe layer 14 formed on the top surface 120 of the fin 12 (i.e. the portion 141 of the SiGe layer 14) and formed on the pair of lateral sidewalls 122 of the fin 12 (i.e. the portion 142 of the SiGe layer 14).

Figure 1D:
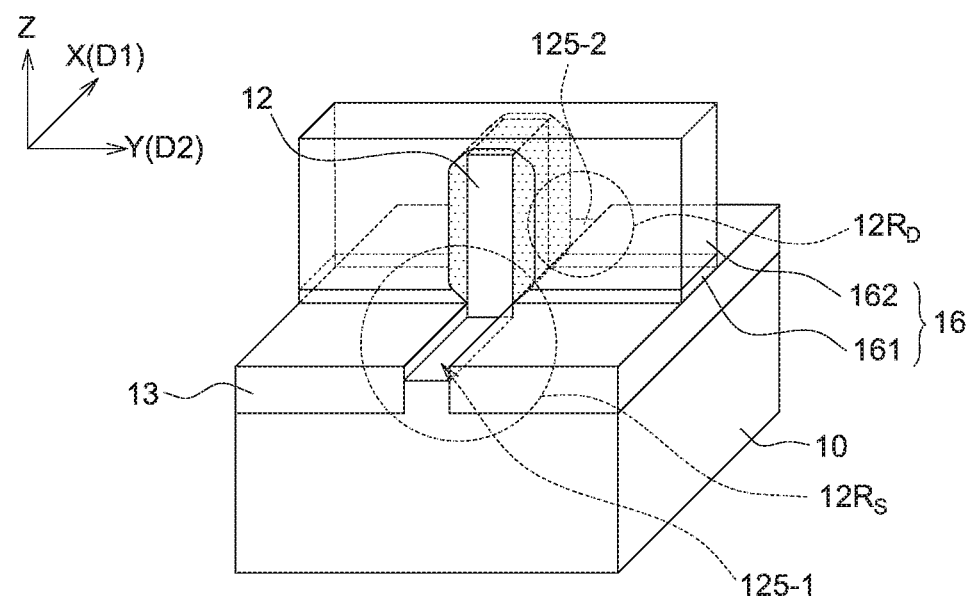

After formation of the gate stack 16, the portions of the fin 12 and the SiGe layer 14 uncovered by the gate stack 16 are removed, so as to form a source region $12R_S$ and a drain region $12R_D$ positioned correspondingly to opposite sides of the fin 12, wherein the opposite sides of the fin 12 are exposed by the gate stack 16, as shown in FIG. 1D. In one embodiment, the source region $12R_S$ comprises a first recessed surface 125-1 below the isolation layer 13, and the drain region $12R_D$ comprises a second recessed surface 125-2 below the isolation layer 13.

Figure 1E:
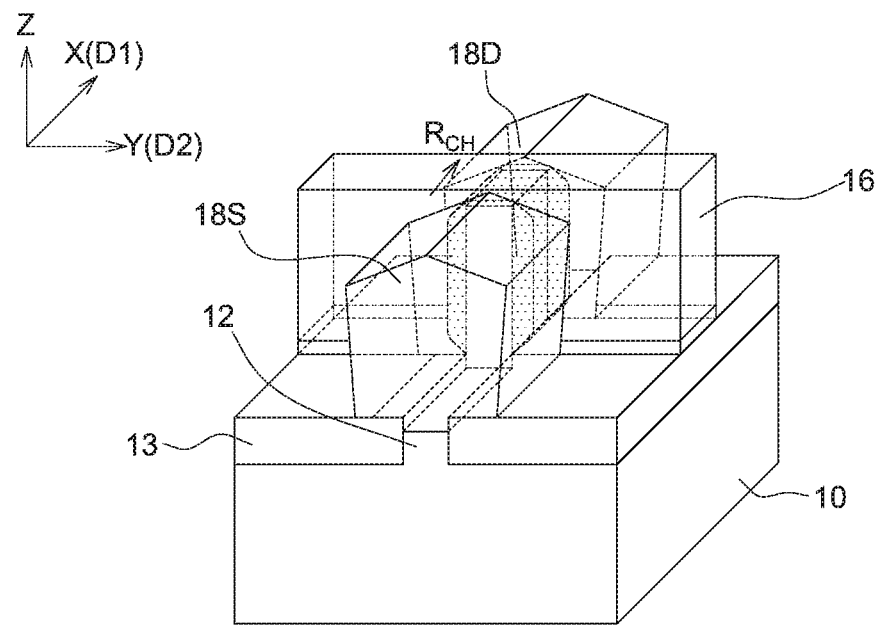

After formation of the source region $12R_S$ and the drain region $12R_D$, a SiGe source 18S is formed at the source region $12R_S$ and a SiGe drain 18D is formed at the drain region $12R_D$, wherein a channel region $R_{CH}$ is formed between the source region $12R_S$ and the drain region $12R_D$, as shown in FIG. 1E. For example, the SiGe source 18S is formed on the first recessed surface 125-1 (FIG. 1D) of the source region $12R_S$, and the SiGe drain 18D is formed on the second recessed surface 125-2 of the drain region $12R_D$. According to the embodied semiconductor device, the channel region $R_{CH}$ comprises the fin beneath the gate stack 16 and the SiGe layer 14 formed on the top surface 120 and on the pair of lateral sidewalls 122 of the fin 12 above the isolation layer 13.

Moreover, in the first embodiment, at least one (ex: both) of the SiGe source and the SiGe drain 18D contacts and completely shields the surfaces of the SiGe layer 14 formed on the top surface 120 and formed on the pair of lateral sidewalls 122 of the fin 12 exposed by the gate stack 16.

According to the first embodiment, a semiconductor device as shown in FIG. 1E, includes a SiGe layer 14 formed (ex: epitaxially grown) on the top surface 120 and the pair of lateral sidewalls 122 of the fin 12 above the isolation layer 13, a gate stack across the portion 142 of the SiGe layer 14 formed on the lateral sidewalls 122 of the fin 12 and the portion 141 of the SiGe layer 14 formed on the top surface 120 of the fin 12.

SECOND EMBODIMENT

Figure 2A:
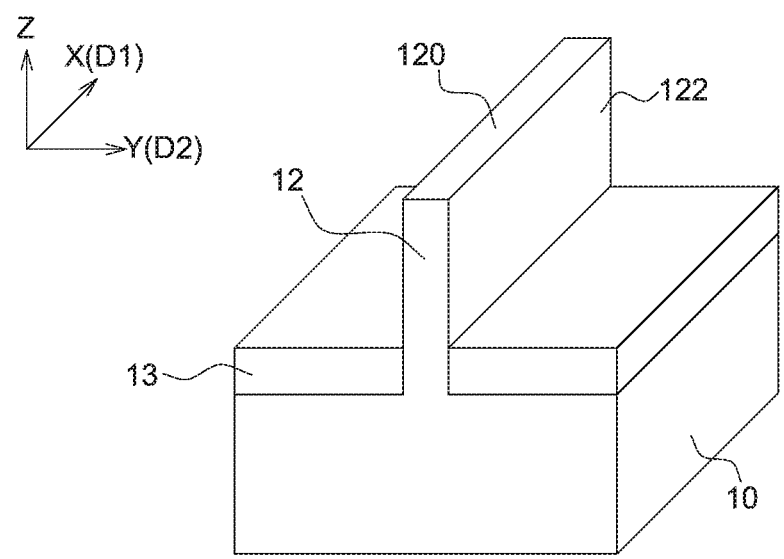
FIG. 2A-FIG. 2F illustrate a method for manufacturing a semiconductor device according to the second embodiment of the disclosure.
Figure 2B:
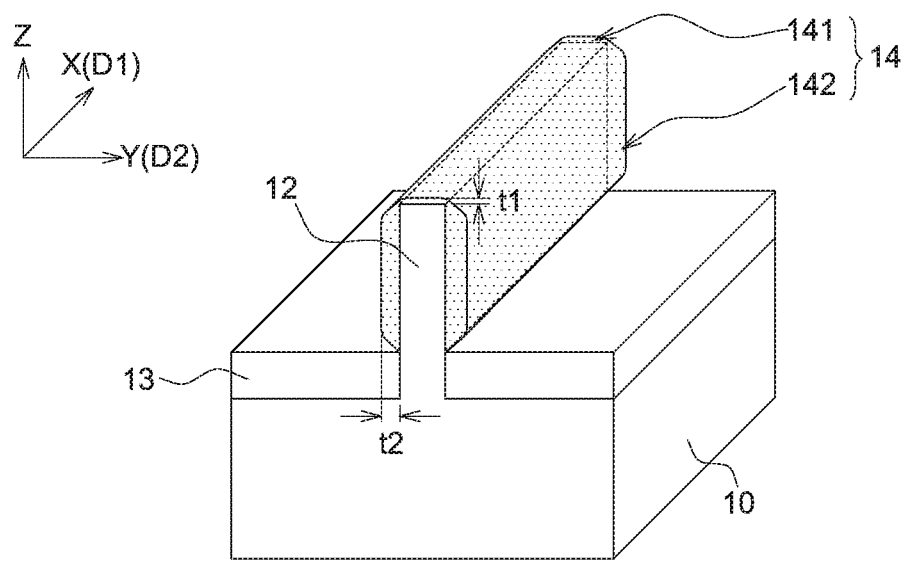

FIG. 2A-FIG. 2F illustrate a method for manufacturing a semiconductor device according to the second embodiment of the disclosure. In the second embodiment, the method further comprises removing the SiGe layer 14 formed on the top surface 120 of the fin 12 before forming the gate stack 16. The identical elements of the second and first embodiments are designated with the same reference numerals for achieving the purpose of clear illustration. Also, the structural and steps details of the related elements have been described in the first embodiment, and would not be redundantly repeated. For example, details of FIG. 2A-FIG. 2B are identical to FIG. 1A-FIG. 1B.

In the second embodiment, after forming the SiGe layer 14 (including the portions 141 and 142) on the top surface 120 and the pair of lateral sidewalls 122 of the fin 12 as shown in FIG. 2B, the method further comprises removing the portion 141 of the SiGe layer 14 formed on the top surface 120 of the fin 12 (before forming the gate stack 16). Accordingly, the portion 142 of the SiGe layer 14 formed on the pair of lateral sidewalls 122 of the fin 12 is remained after removal of the portion 141 of the SiGe layer 14 (i.e. formed on the top surface 120 of the fin 12). In one embodiment, the portion 141 of the SiGe layer 14 formed on the top surface 120 of the fin 12 can be removed by hydrochloric acid (HCl).

Figure 2C:
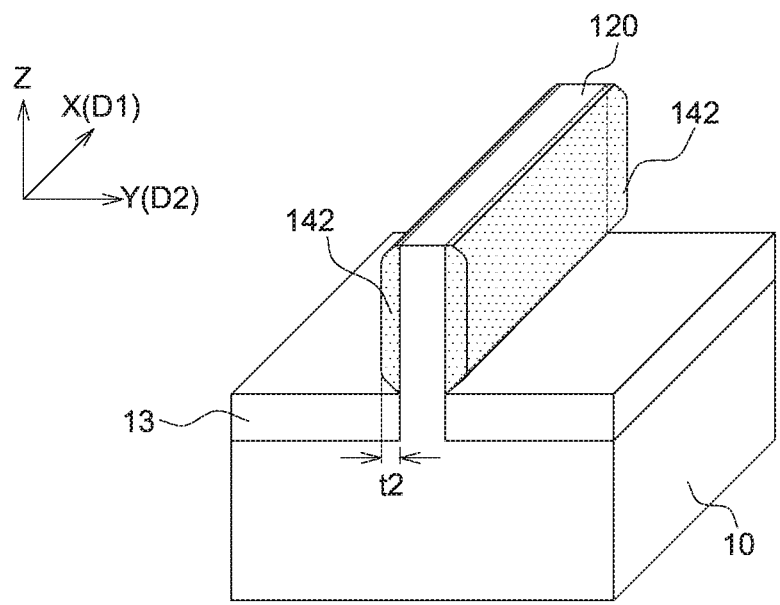
Figure 2D:
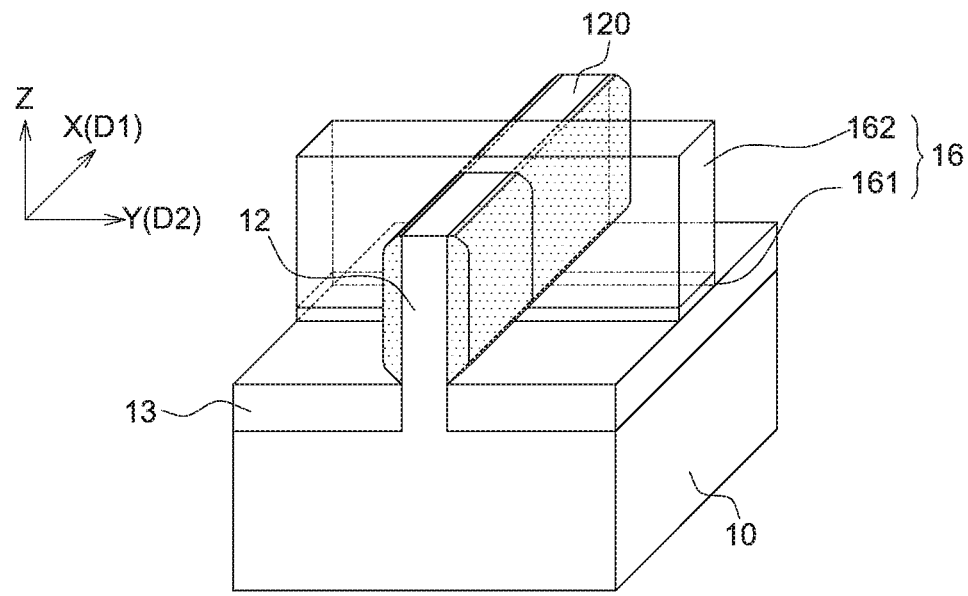
Figure 2E:
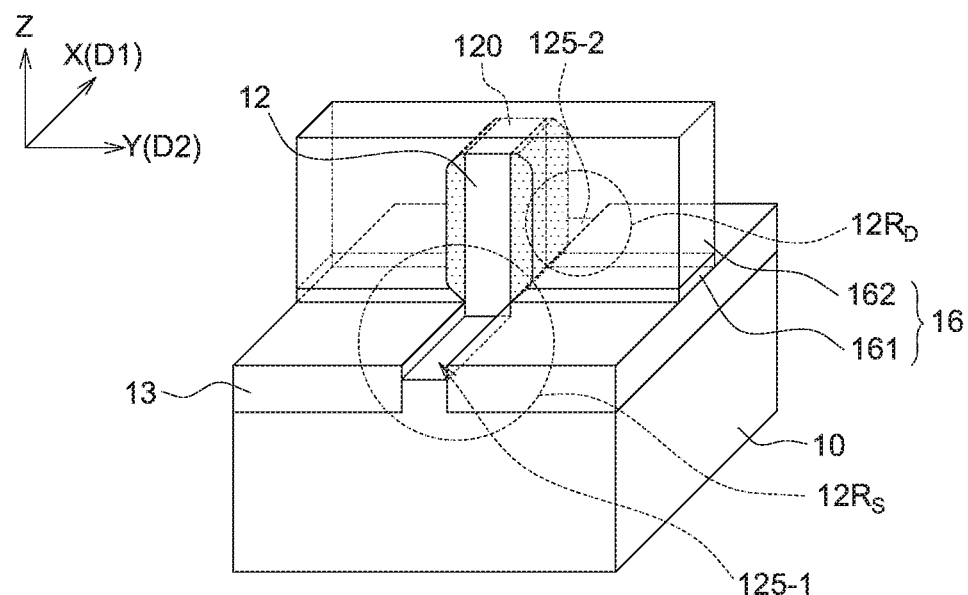
Figure 2F:
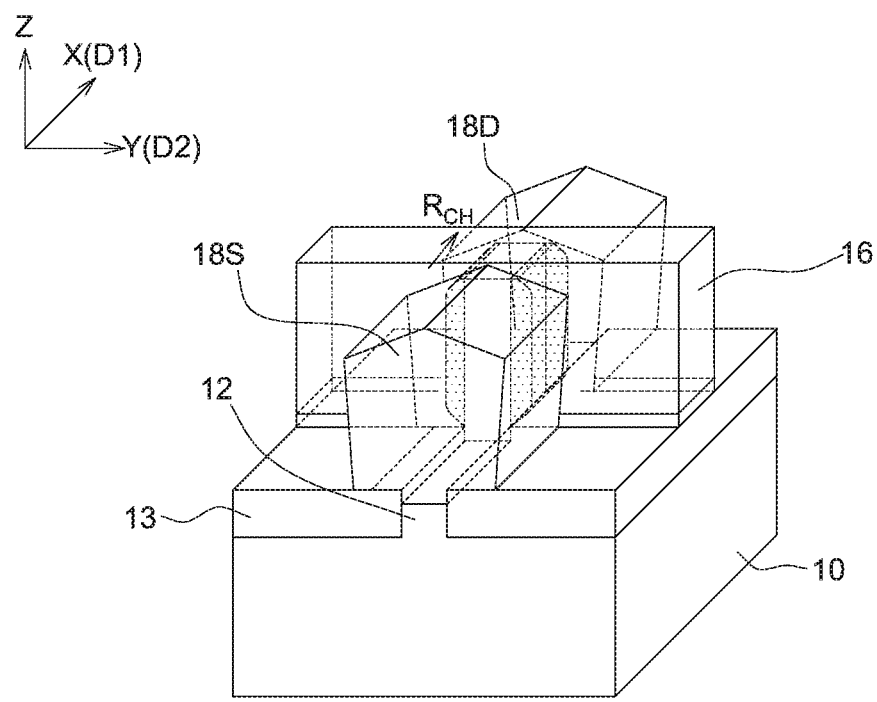

After removal of the portion 141 of the SiGe layer 14, the subsequent procedures of the second embodiment (ex: FIG. 2D-FIG. 2F) are similar to the subsequent procedures of the first embodiment (ex: FIG. 1C-FIG. 1E).

As shown in FIG. 2D, a gate stack 16 is formed on the isolation layer 13 and across the top surface 120 and the pair of lateral sidewalls 122 of the fin 12 in the second embodiment, wherein the gate stack 16 extends along the second direction D2 (such as Y-direction) and the fin 12 extends along the first direction D1 (such as X-direction). In the second embodiment, the gate stack 16 includes a gate dielectric layer 161 formed on the isolation layer 13 and a gate electrode layer 162 formed on the gate dielectric layer 161, wherein the gate dielectric layer 161 contacts the SiGe layer 14 formed on the pair of lateral sidewalls 122 of the fin 12 and contacts the top surface 120 of the fin 12 (since the portion 141 of the SiGe layer 14 has been removed as shown in FIG. 2C).

After formation of the gate stack 16, the source region $12R_S$ and the drain region $12R_D$ positioned correspondingly to opposite sides of the fin 12 are formed, as shown in FIG. 2E. Then, the SiGe source 18S is formed on the first recessed surface 125-1 (FIG. 2E) of the source region $12R_S$, and the SiGe drain 18D is formed on the second recessed surface 125-2 of the drain region $12R_D$, as shown in FIG. 2F.

According to the aforementioned description, the SiGe layer 14 formed on the lateral sidewalls 122 of the fin 12 would increase the strain of the bottom of the fin above the isolation layer 13, so that the strain difference between the bottom and the top of the fin 12 can be reduced. Several measurements have been conducted to obtain strain conditions of the fins. The measurement results indicate that a fin without a SiGe layer formed on the lateral sidewalls possesses a top strain much higher than a bottom strain. Large strain difference between the top and bottom of a fin would have considerable effect on the carrier mobility in the channel of the finFET. The measurement results of embodied devices, each comprising a SiGe layer at least formed on the lateral sidewalls of the fin, indicate that the strains of the bottoms of the fins have significantly increased (i.e. the strain difference between the bottom and the top of the fin is significantly reduced), thereby effectively increasing the carrier mobility in the channel.

Figure 3A:
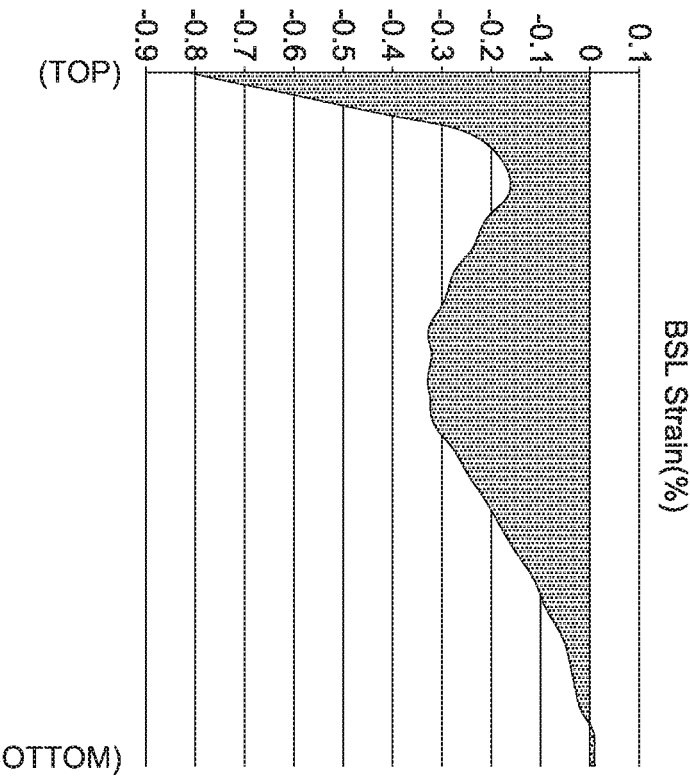
FIG. 3A presents a strain distribution of the top and the bottom of the fin according to a conventional semiconductor device.
Figure 3B:
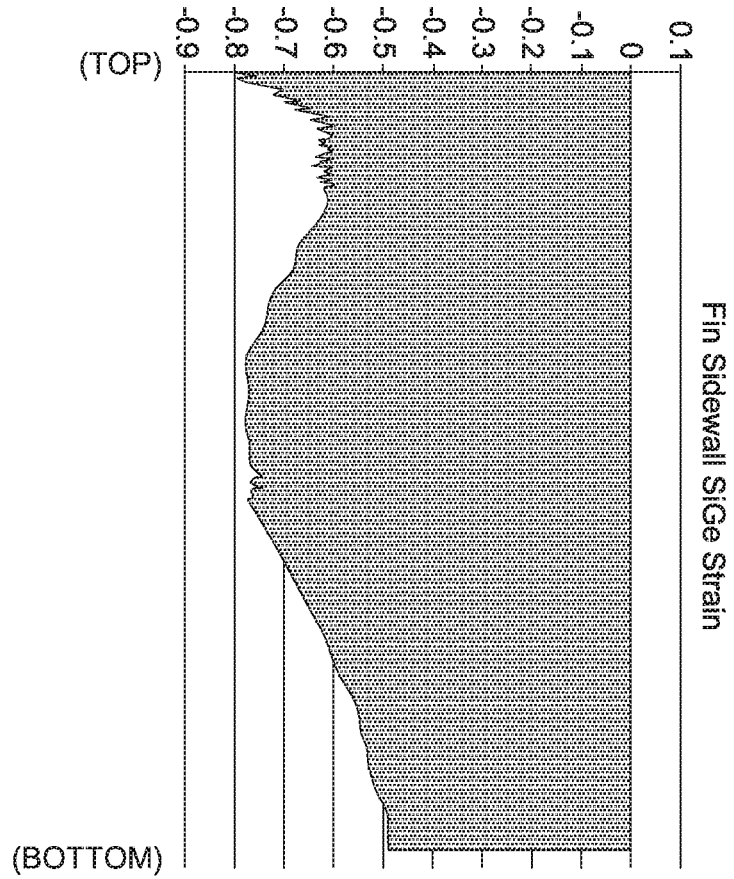
FIG. 3B presents a strain distribution of the top and the bottom of the fin according to an embodied semiconductor device.

A set of measurement results is presented for illustration. Please refer to FIG. 3A and FIG. 3B, which respectively present the strain distributions of the tops and the bottoms of the fins according to a conventional semiconductor device and an embodied semiconductor device. A fin without SiGe layer formed on the lateral sidewalls (i.e. conventional semiconductor device) possesses a top strain of about 80 and a bottom strain of about 0 as shown in FIG. 3A, while a fin with a SiGe layer 14 formed on the lateral sidewalls 122 (i.e. an embodied semiconductor device) possesses a top strain of about 80 and a bottom strain of about 50 as shown in FIG. 3B. Accordingly, the strain difference between the bottom and the top of the fin 12 of the embodiment do greatly decrease. Reduced strain difference between the bottom and the top of the fin effectively increases the carrier mobility in the fin channel $R_{CH}$. Additionally, the SiGe layer 14 formed on the lateral sidewalls 122 of the fin 12 is a thin layer (compared to other components such as the fin 12 and the gate stack 16); in one embodiment, the SiGe layer 14 formed on the lateral sidewalls 122 has a thickness of about 20Å to 50Å, and there is no dislocation occurring in the device structure of the embodiment. Thus, the SiGe layer 14 of the embodiment has no bad influence on the properties of the semiconductor device.

Other embodiments with different configurations of known elements in the semiconductor devices can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
   providing a substrate with an isolation layer formed thereon, wherein the substrate has a fin protruding up through the isolation layer to form a top surface and a pair of lateral sidewalls of the fin above the isolation layer;
   epitaxially growing a silicon-germanium (SiGe) layer on the top surface and the pair of lateral sidewalls of the fin, wherein the SiGe layer formed on the top surface has a first thickness, the SiGe layer formed on said lateral sidewall has a second thickness, and a ratio of the first thickness to the second thickness is in a range of 1:10 to 1:30; and
   forming a gate stack on the isolation layer and across the top surface and the pair of lateral sidewalls of the fin, wherein the fin extends along a first direction, and the gate stack extends along a second direction different from the first direction.

2. The method according to claim 1, wherein the first thickness of the SiGe layer is a maximum thickness of the SiGe layer formed on the top surface of the fin, and the second thickness of the SiGe layer is a maximum thickness of the SiGe layer formed on said lateral sidewall of the fin.

3. The method according to claim 1, wherein the SiGe layer is grown by using a precursor comprising:
   dichlorosilane (DCS, $SiCl_2H_2$) or silane ($SiH_4$) in a flow rate larger than 100 standard cubic centimeters per minute (sccm).

4. The method according to claim 3, wherein the precursor comprises dichlorosilane or silane in the flow rate larger than 100 sccm but no more than 300 sccm.

5. The method according to claim 3, wherein the precursor further comprises germane ($GeH_4$) in a flow rate of 200 sccm to 900 sccm.

6. The method according to claim 5, wherein the precursor further comprises hydrochloric acid (HCl) in a flow rate of 150 sccm to 300 sccm.

7. The method according to claim 1, wherein the SiGe layer contains 20% to 75% of germanium (Ge).

8. The method according to claim 1, wherein the second thickness of the SiGe layer formed on one of the pair of lateral sidewalls of the fin is in a range of 20Å to 50Å.

9. The method according to claim 1, after formation of the gate stack, the method further comprises:
  removing portions of the fin and the SiGe layer uncovered by the gate stack, so as to form a source region and a drain region positioned correspondingly to opposite sides of the fin, wherein the opposite sides of the fin are exposed by the gate stack; and
  forming a SiGe source at the source region and forming a SiGe drain at the drain region,
  wherein a channel region is formed between the source region and the drain region.

10. The method according to claim 9, wherein the gate stack comprises:
  a gate dielectric layer, formed on the isolation layer and contacting the SiGe layer formed on the top surface and formed on the pair of lateral sidewalls of the fin; and
  a gate electrode layer formed on the gate dielectric layer.

11. The method according to claim 1, further comprising:
  removing the SiGe layer formed on the top surface of the fin before forming the gate stack, wherein parts of the SiGe layer on the pair of lateral sidewalls of the fin are remained after removal of the SiGe layer formed on the top surface of the fin.

* * * * *